United States Patent
Edgington et al.

(10) Patent No.: US 10,552,311 B2
(45) Date of Patent: *Feb. 4, 2020

(54) RECOVERY FOR NON-VOLATILE MEMORY AFTER POWER LOSS

(71) Applicant: Micron Technology, Inc., Boise, ID (US)

(72) Inventors: Joseph Douglas Edgington, Sacramento, CA (US); Hisham Chowdhury, Fair Oaks, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/477,169

(22) Filed: Apr. 3, 2017

(65) Prior Publication Data

US 2017/0206157 A1 Jul. 20, 2017

Related U.S. Application Data

(63) Continuation of application No. 12/347,935, filed on Dec. 31, 2008, now Pat. No. 9,612,954.

(51) Int. Cl.
| | |
|---|---|
| *G06F 12/00* | (2006.01) |
| *G06F 12/02* | (2006.01) |
| *G06F 3/06* | (2006.01) |
| *G06F 12/1009* | (2016.01) |
| *G11C 16/10* | (2006.01) |

(52) U.S. Cl.
CPC .......... *G06F 12/0246* (2013.01); *G06F 3/064* (2013.01); *G06F 3/0679* (2013.01); *G06F 12/1009* (2013.01); *G11C 16/102* (2013.01); *G06F 2212/7202* (2013.01); *G06F 2212/7209* (2013.01)

(58) Field of Classification Search
None
See application file for complete search history.

(56) References Cited

U.S. PATENT DOCUMENTS

| 5,008,786 A | * | 4/1991 | Thatte | G06F 9/4435 |
|---|---|---|---|---|
| | | | | 711/162 |
| 5,337,275 A | | 8/1994 | Garner | |
| 5,404,485 A | | 4/1995 | Ban | |

(Continued)

FOREIGN PATENT DOCUMENTS

| CN | 1991790 A | 7/2007 |
|---|---|---|
| CN | 101025715 A | 8/2007 |

(Continued)

OTHER PUBLICATIONS

"Chinese Application Serial No. 200910222338, Office Action dated Jan. 24, 2013", w/English Translation, 9 pgs.

(Continued)

*Primary Examiner* — David Yi
*Assistant Examiner* — Craig S Goldschmidt
(74) *Attorney, Agent, or Firm* — Schwegman Lundberg & Woessner, P.A.

(57) ABSTRACT

Non-volatile memory array can be recovered after a power loss. In one example, pages of a memory array are scanned to find a first free page after the power loss. The first free page is marked as available, and the page marked as available is written to with the next write cycle.

17 Claims, 7 Drawing Sheets

(56) References Cited

U.S. PATENT DOCUMENTS

| | | | |
|---|---|---|---|
| 6,170,066 B1 | 1/2001 | See | |
| 6,675,278 B1 | 1/2004 | Chowdhary et al. | |
| 2005/0055531 A1* | 3/2005 | Asami | G06F 12/0246 |
| | | | 711/203 |
| 2007/0174355 A1 | 7/2007 | Woo et al. | |
| 2009/0037456 A1* | 2/2009 | Kirshenbaum | G06F 17/30097 |
| 2010/0106753 A1 | 4/2010 | Prabhakaran et al. | |
| 2010/0169543 A1 | 7/2010 | Edgington et al. | |

FOREIGN PATENT DOCUMENTS

| | | |
|---|---|---|
| CN | 101770809 A | 7/2010 |
| CN | 101770809 B | 3/2014 |
| DE | 10321104 A1 | 11/2004 |
| DE | 102005021053 A1 | 3/2006 |
| DE | 102009051862 A1 | 7/2010 |
| EP | 1187143 A2 | 3/2002 |
| JP | 2004264912 A | 9/2004 |
| JP | 2006195565 A | 7/2006 |
| JP | 2007058840 A | 3/2007 |
| JP | 2010157216 A | 7/2010 |
| JP | 2003015929 A | 1/2013 |
| KR | 101613678 B1 | 4/2016 |
| SG | 162655 A1 | 7/2010 |
| SG | 196777 | 7/2017 |
| WO | WO-2008087634 A1 | 7/2008 |

OTHER PUBLICATIONS

"Chinese Application Serial No. 200910222338, Office Action dated Apr. 24, 2013", w/English Translation, 16 pgs.

"Chinese Application Serial No. 200910222338, Office Action dated Aug. 10, 2012", w/English Translation, 23 pgs.

"Chinese Application Serial No. 200910222338, Response filed Jul. 9, 2013 to Office Action dated Apr. 24, 2013", w/English Translation, 19 pgs.

"Chinese Application Serial No. 200910222338, Response filed Dec. 25, 2012 to Office Action dated Aug. 10, 2012", w/English Translation, 37 pgs.

"Chinese Application Serial No. 200910222338.0, Response filed Mar. 28, 2013 to Office Action dated Jan. 24, 2013", w/English Translation, 3 pgs.

"German Application Serial No. 1020090518622-53, Office Action dated Sep. 27, 2012", w/ EN Translation, 7 pgs.

"German Application Serial No. 102009051862.2, Office Action dated Nov. 4, 2014", w/English Translation, 13 pgs.

"German Application Serial No. 102009051862.2,, Office Action received Jul. 13, 2011", w/English Translation, 10 pgs.

"German Application Serial No. 102009051862.2-53, Office Action dated Feb. 7, 2013", w/English Translation, 8 pgs.

"German Application Serial No. 102009051862.2-53, Office Action Response filed Feb. 20, 2012", With English Translation, 14 pgs.

"German Application Serial No. 102009051862.2-53, Response filed Feb. 5, 2013 to Office Action dated Sep. 27, 2012", w/English Claims, 17 pgs.

"German Application Serial No. 102009051862.2-53, Response filed Jul. 30, 2013 to Office Action dated Feb. 7, 2013", w/English Translation, 12 pgs.

"Japanese Application Serial No. 2009-269278, Office Action dated Dec. 9, 2013", w/English Translation, 5 pgs.

"Japanese Application Serial No. 2009-269278, Response filed Feb. 10, 2014 to Office Action dated Dec. 9, 2013", w/English Translation, 8 pgs.

"Japanese Application Serial No. 2009-269278, Voluntary Amendment Filed Dec. 20, 2012", w/English Claims, 11 pgs.

"Korean Application Serial No. 10-2009-0109644, Office Action dated Jul. 21, 2015", no English Translation, 6 pgs.

"Korean Application Serial No. 10-2009-0109644, Response filed Oct. 19, 2015 to Office Action dated Jul. 21, 2015", w/English Claims, 25 pgs.

"Singaporean Application serial No. 201309691-2, Request to Amend Application Before Grant filed Jun. 22, 2017", 38 pgs.

Hudgens, S., et al., "Overview of Phase-Change Chalcogenide Nonvolatile Memory Technology", MRS Bulletin, (Nov. 2004), 829-832.

U.S. Appl. No. 12/347,935 U.S. Pat. No. 9,612,954, filed Dec. 31, 2008, Recovery for Non-Volatile Memory After Power Loss.

* cited by examiner

RECOVERY FOR NON-VOLATILE MEMORY AFTER POWER LOSS

Non-volatile memory devices provide a benefit of storing data without requiring any power to safely maintain the stored data. However, reading the stored data and initially writing the data does require power. In many non-volatile memory types, data is typically safe during read operations regardless of a power failure. However, if the power is interrupted or fails during a write process, not only does the writing stop, but some cells may have unstable values written to them. It may then become difficult, after power is restored, to determine where the writing should begin again.

Moreover, checking the values already stored in memory may not reliably indicate where the writing should begin again. In flash memory, for example, the value in a memory cell is stored by setting a charge. The voltage on the charge element is compared to a threshold to determine whether the stored value is a zero or a one. If the stored value is near the threshold because the power went out before the intended charge was set, then it might read zero at some times and one at other times. Similarly, in a phase change memory cell the value is stored, by setting the resistance of a phase change material. The resistance is compared to a threshold and if the resistance is near the threshold, then the cell might read zero at some times and one at other times. Such unstable or inconsistent memory values can occur in any type of non-volatile memory in which a memory cell can take on a range of values.

There are methods of protecting a system from crashing because of unstable data that remains in a flash memory after a power loss. The protection methods will typically involve scanning the whole memory device or rewriting the entire file over again from the beginning. However, with unstable memory values, scanning the memory may not provide an accurate answer. On the other hand, rewriting the data can be time consuming.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
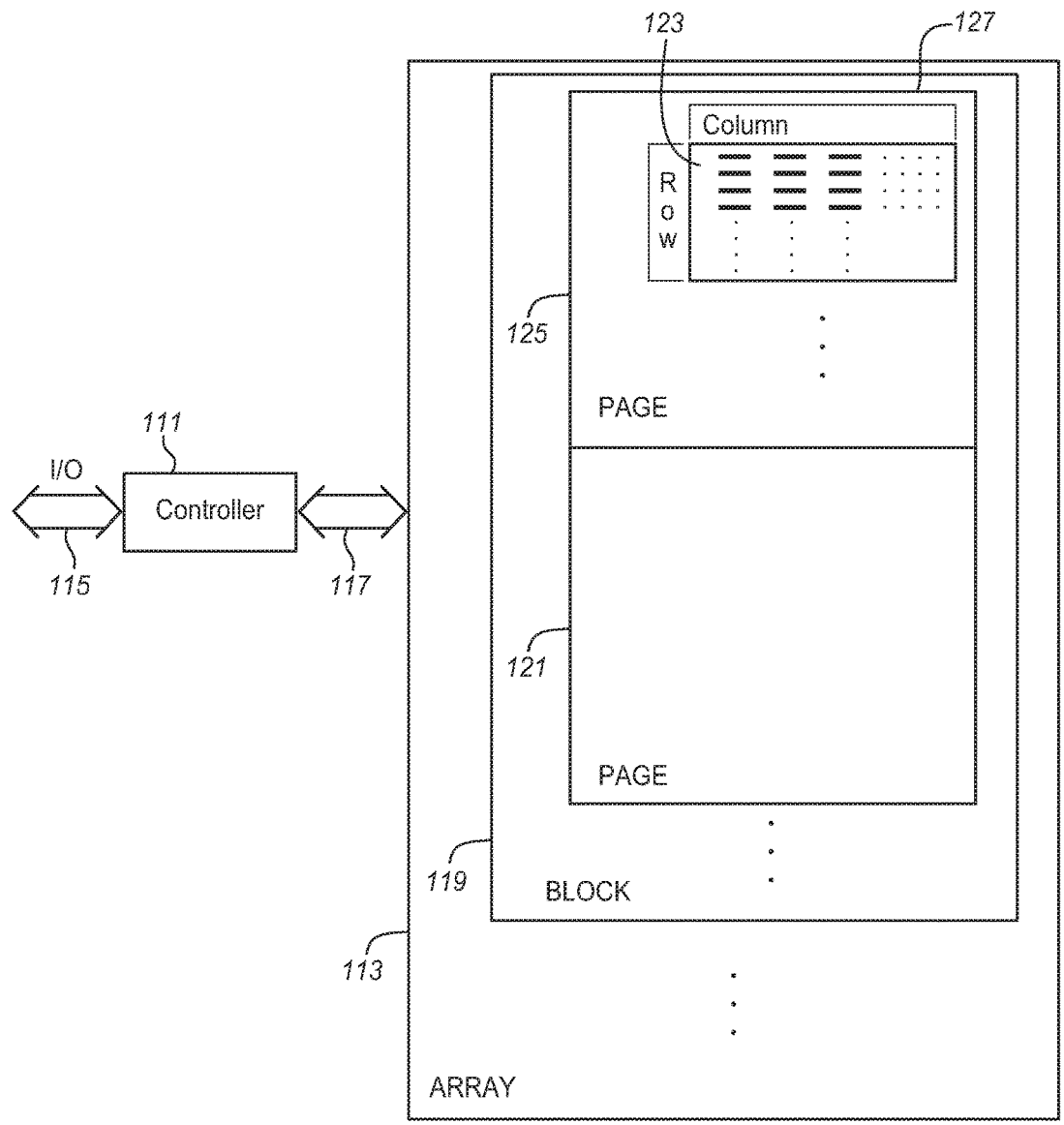
FIG. 1 shows a block diagram of a flash memory array with memory cells organized into pages and block in accordance with an embodiment.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

Embodiments of the present invention may provide complete coverage for data integrity when a power loss event occurs during a flash or any other non-volatile memory hardware programming operation. Accordingly, unstable, corrupted, or partially programmed data fragments can safely be distinguished from good data fragments. This allows a power loss recovery to be performed in an optimized manner. This enables partial rewriting of the memory to be directed to a particular area of a memory device, resulting in fewer write cycles to obtain a full power loss recovery. This provides better memory life cycles by reducing the number of writes. It also helps avoid hardware errors especially for NAND type flash memory devices. Embodiments of the present invention may be applied to a wide range of different non-volatile memories including NOR (not or) flash, NAND (not and) flash and PCM. It can also be applied to a wide range of different memory file systems and memory sector management systems.

According to an embodiment of the invention, a sequential model is used for writing data on a per-block basis to the memory device. In this model the first available space or first free space is always used when writing new data in the device. During system initialization, and following an unexpected shutdown, the worst-case corruption to the un-written area of the memory is assumed. Because in, for example a flash memory, pages in one block are written sequentially, it is not necessary to invalidate an entire memory block or an entire memory array when there is a power loss or interruption. Instead, by intelligently determining which pages may have incurred corruption, these particular pages can be the focus of the repair.

Data corruption occurs when the power is lost while writing a data fragment to the memory device in use. This corruption results in bits within the device existing in an unknown state. The unknown state may be a correct value, an incorrect value or an invalid value that is unstable or unreliable.

To recover completely from a power loss, either the entire memory must be rewritten or there must be some way of determining the state of each memory cell in an array. In many types of non-volatile memory systems including flash and PCM, as discussed above, a disruption in system power during a program or erase operation can and will likely leave some memory cells in unknown states. These states may be zero or one or somewhere in between.

One approach to recovery is to simply read the flash and assume that if it reads back as the erased value, then it is in the erased state. However, because the value of each cell in a flash memory exists in an analog state, only after successful programming or erasing can it be considered to represent a binary value.

Another approach is to first mark an area of memory as invalid (or dirty), before writing values to this area. However, because some flash devices only permit a limited number of programming operations to a page before it must be erased, writing a "dirty" marker increases the number of writes that must be performed for each piece of data written.

This slows down the write speed of the writing software because it increases the frequency with which the page must be erased and then the same values rewritten.

Another approach is to attempt to safely track what areas of a memory array are in use at all times. This approach reduces run-time write speed. In another approach, specific writing sequences are used to minimize the probability of failure occurring.

In another approach, every page is read in order to confirm its validity. This not only takes times but is not completely safe because an unstable cell may read accurately one time and inaccurately another time.

By contrast, in embodiments of the present invention, by assuming the worst case, the overhead of having to read each data bit is eliminated and it can be assured that only stable memory cells are used. In another words, embodiments of the present invention assume that every data area is not safe to use unless there is an indication otherwise. As explained below, the system is safely maintained and recovered in the case of a power loss event during a program or erase operation. At the same time system performance is not compromised.

An example of a flash memory system is shown in FIG. 1. The system has a controller 111 and an array 113. The controller is coupled has an input/output bus 115 to receive data to store in the array and the send data read from the array. The controller is also coupled to a memory bus through which it controls and maintains the array. It also writes data to the array and reads data from the array through the memory bus.

The array 113 is divided into one or more blocks 119 and each block contains one or more pages 121. The pages contain individual memory cells 123 to store the data using a charge. The block also contain the necessary circuitry for reading, writing and flashing the memory cells. These are shown in FIG. 1 as a row controller 125 and a column controller 127. The number of components in any particular system will depend upon the configuration of the system and its intended application. A page may have cells to store 512 to 2K 8-bit bytes of data. However, 16, 32, and 64-bit bytes may alternatively be used and the size of a page may be smaller or larger. Each block may have 16, 32, 64, or 128 pages, although more or fewer are also possible. Each array may have 8 or 16 blocks, depending on the application. Some arrays have a single block in order to simplify the construction. A larger array may have many more blocks. The numbers provided herein are provided as examples and the invention is not limited to any particular block size.

In typical flash operations, an entire block is flashed at one time. This erases any values stored on the block and sets all bits to the same value, typically zero. However, the flashed cells may be interpreted as having the value one instead. Each cell is then programmed as needed with a one or allowed to remain in the zero state. The writing process consists of programming the flashed cells. After each cell is programmed, it can only be rewritten after being flashed again. Since this erases the whole block, smaller blocks may be preferred for memories that will frequently have small changes in the stored data. Larger blocks may be more efficient for memories that will be infrequently changed or for which cost is more important.

Data is typically written one page at a time. In a typical example, data is written all to the same page in a single write cycle. When the write cycle is completed, a commit marker is place for that page and the page cannot be written to again. If the power is interrupted during the write cycle, then the values in memory can be unstable. In another memory configuration, two or more write cycles can be directed to a single page before the commit maker is written.

For the flash memory example of FIG. 1, a page is considered the smallest granularity of a data-element that can be written to the device. Similarly, the largest data fragment size is considered to be the remainder of the block. In this example, a data fragment may not cross a block boundary. Other types of memory can be organized into pages and blocks, or alternatively, the approaches described here can be adapted to other types of memory structures.

If a device is in operation during a power interruption, it may be writing to some page in the flash memory cell array. After the power interruption, iterating through each valid block of the device, each header of each page can be scanned to find an empty page header. This page can be considered as the first un-written page or flashed but not programmed page.

In some flash memory arrays, each page has extra cells called a free space or spare area or space. These cells are built into the array to be used in case other cells in the page fail and may also be used for housekeeping or management purposes. The header may be stored in this free space.

In one example each page has an error correction code (ECC) and a header. The header is used to write a commit marker when the page has been successfully fully programmed or written to. The commit marker can be used to indicate whether a programming operation has been successfully completed or not. The marker is written after a programming operation is completed successfully. For flash memory, after the cells are flashed, or erased, the process of writing to the cells is referred to as programming.

In one example, each page has a header that is written to when the page is flashed and when the page is programmed. The header will then track the number of valid programmed registers. If the header reads full, then the page has programmed registers, the page and is not free and since this is the first block, the process moves on to the first un-written page. As an alternative, the header may be only for an entire block or for some other subset of the array. The header can be in the free space, in a separate table, or in a specifically allocated portion of the page or block.

After a power loss, the memory is scanned to determine which pages are valid and which pages are not. It is safest to assume that any one of the blocks may contain power-loss data when restarting or mounting the memory manager, such as memory management software. When scanning the block, there are four possible power-loss states in which a block may be found:

1.) The last data fragment found contains a commit marker.

2.) The last data fragment found is an empty fragment.

3.) An incomplete data fragment is found. This can be indicated by an invalid header or a valid header without a commit marker.

4.) A reclaim or flash erase was in progress on the block and there is neither data nor header.

In cases 1 and 2, the power-loss assumption means that the last write to this block (the one that experienced power-loss) was to the first FREE page found when scanning the block. In one example, the action to take is to physically mark this page (first free page) as dirty, and use the following page as the first available FREE page in this block. The dirty marker is a way to indicate that the data in this page is not valid and that it should be flashed, cleared, reclaimed, or rewritten with new data, depending on the type of memory array. Similarly, if the first FREE page found is the first page of the block, then the first FREE page can be marked as dirty.

However, in this case, there is no previous valid data fragment. The next page becomes the first FREE page and this is where new writes are made.

The dirty marker can be written in a variety of different ways. In one example, the header id or a combination of different fields in the header are programmed to all 0s. However, other markers can be used instead. Subsequent mounts of this block will see the data fragment with the invalid header fields as dirty space.

The dirty marker presents a clear benefit. When the memory controller begins writing new data, it looks for the next location. This is the location after the last location that was written to in its sequence. This location will be in the first FREE page. If you page is not marked to show as dirty, then subsequent mounts will consider the skipped page to be the first free page. By marking it dirty, the page is skipped and the next page is used. This allows this page to be cleared before it is used again.

In case 3, the header is invalid, or the data fragment does not have a commit mark. Such a page or block was in the progress of being written to when the power loss occurred. Accordingly all of the affected data is unreliable including any information written to the header, such as the size of the valid or invalid fragment. In one example, it is assumed that the power-loss could have occurred while writing to any page of this data fragment and that the particular page cannot be safely determined. Therefore it is assumed that the data fragment was of the maximum size which is the rest of the block. Accordingly, the rest of this block is considered dirty and can be marked as such. It may not be necessary to actually mark the affected pages as dirty, if addition data fragments are not going to be written to those pages. Later mounts that see an invalid header, or no commit mark, will populate the block the same way every time.

On the other hand, If the header is unstable, then a future mount might read the first page of this fragment as FREE space. This then corresponds to power loss case 1. The unstable header will be marked as dirty and not relied upon. In either case, the space marked as dirty will be recovered when the block is reclaimed. As can be seen through these examples, handling all the power-loss cases during mount prevents any impact to the write performance after the system starts up.

In case 4, if a reclaim was in progress on the block, then the reclaim process is simply restarted. The other solutions are not needed. Other approaches can be used to more specifically address this case.

Figure 2:
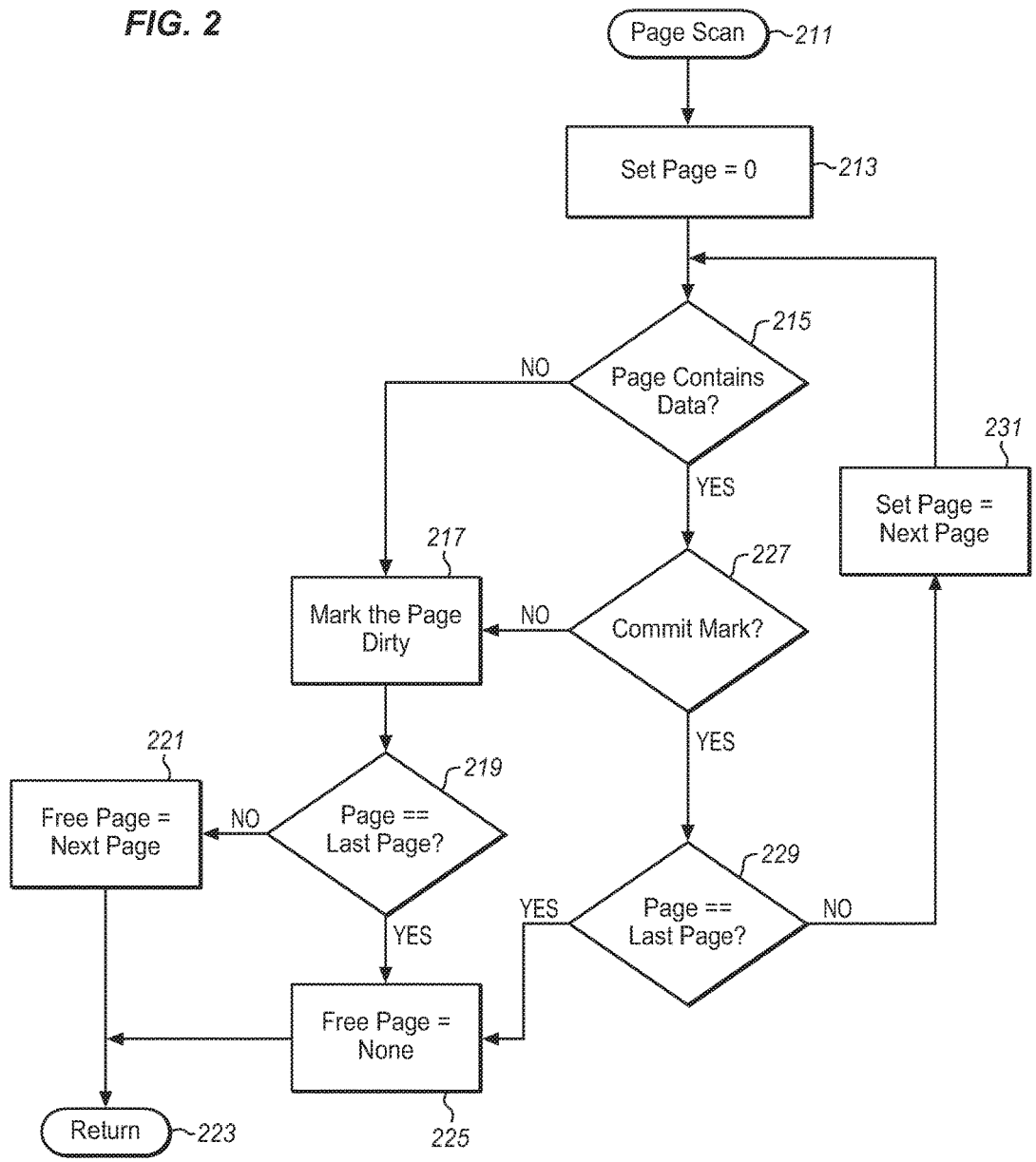
FIG. 2 is a process flow diagram of scanning pages of a memory array to find a first free page in accordance with an embodiment.

The ideas described above can be shown using flow charts. FIG. 2 is an example of one type of basic page scanning. The process of FIG. 2 will scan through each page of a block with the goal of finding the next FREE page. The free page is the next page to be used for programming. In other words, the free page is the next page that will be written to in this block.

At box 211, the page scan process is started. This may occur at any time, however, in the example above, it occurs after a power loss occurs during a write to the memory. It can also occur at every start-up or at every start-up after a power loss event. The initialization selects the block at which to start. Typically, if there is more than one block, then the blocks will be ordered in some way with numerical indicators, e.g. from 0 to 4. The ordering corresponds to the order in which they are filled. The first block will typically be the only block in the array or the first block, labeled 0. However the process may start at any block.

At box 213, the first page in the sequence is selected. As mentioned above, the memory controller typically has a sequence that it uses to write to pages in the array. The particular sequence depends upon the particular design of the memory array. The number 0 typically corresponds to a logical ordering, rather than a physical or positional ordering. At box 215 the page-by-page scanning starts.

If the page does not contain any data, then at box 217, the page is marked as dirty. Note that, only the first empty page found in the managed device is marked dirty with the approach described in FIG. 2, and the following page becomes the first free page. At box 219, it is determined whether this page is the last page. If it is not, then at box 221, the next page is marked as a free page and at box 223, the process ends. On the other hand if this page with no data is the last page, then at box 225, there is no free page and the process ends at box 223.

If a page in the scan does contain data, then the process next checks the header for a commit marker at box 227. In this example, after a page is successfully and completely written, then a commit marker is written into the header. As an alternative, there is a commit marker only for an entire block. This saves time when writing to each page and because a power loss is a rare event, there is rarely any impact on system recovery when there is a power loss.

If there is no commit marker for the page, then the page is again marked as dirty at box 217. As before with the dirty page, if there is a next page at box 219, then at box 221, it is marked as free.

If there is a commit marker for the page with data, then it is assumed that this is a good page and the scan continues to the next page. In FIG. 2, at box 229, if the current page is not the last page, then at box 231, the scan continues to the next page. If this is the first iteration, then the current page will be the first page (page 0) in the first block (block 0). As with the blocks, they are typically ordered and all writes will be to one page until that page is full. The writing will then move to the next page in the sequence (page 1, block 0). Accordingly, during this power loss recovery process, the pages are analyzed in the same order.

If the current page is the last page at box 229, then the there is no free page at box 225 and the process ends at box 223.

As shown by the return loops in FIG. 2, the process of FIG. 2 may iterate through each valid block of the memory array, one page at a time. The process will scan each page until it finds the first un-written page. This is indicated in one embodiment by the page header being empty.

Figure 3:
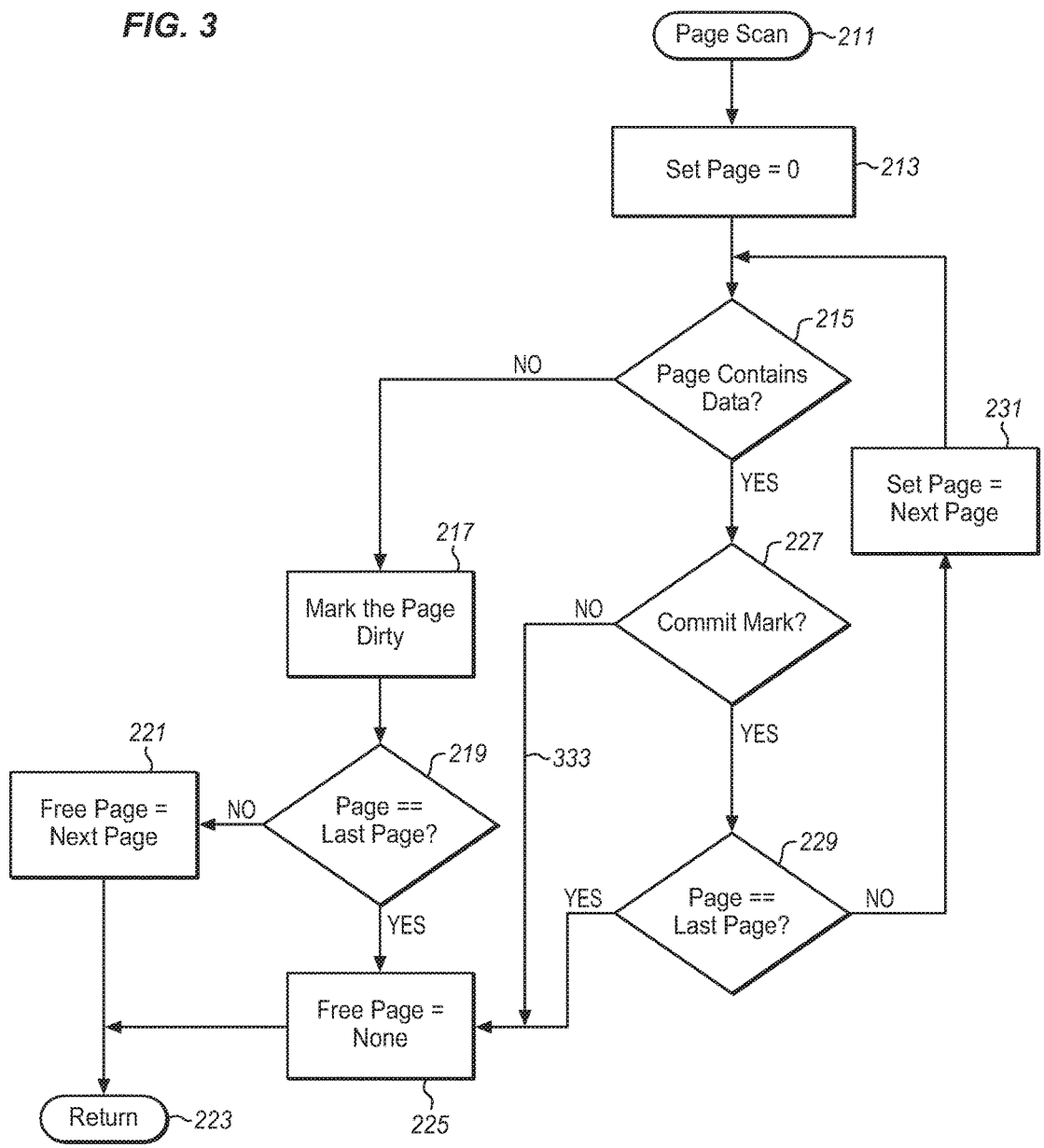
FIG. 3 is a process flow diagram of scanning pages of a memory array to find a first free page in accordance with another embodiment.

FIG. 3 shows a variation on the operations described above. FIG. 3 is the same as FIG. 2 except for a change in the connection between the commit mark determination box 327. Here when a page contains data at box 315, but does not contain a commit mark at box 327, then instead of marking the page dirty at box 317, the process marks the block as having no free pages. Accordingly, the process will scan through each page of a block cycling through boxes 315, 327, 329 and 331. When the next free page is found, the free page is the next page to be used for programming, the process still branches off to mark, the preceding page as dirty and indicate the free page.

In FIG. 3, there is a change made in the process and the file system that writes the commit mark. In this example, commit mark is not kept for each page, but for larger fragments of many pages. This fragment can be a block or some other grouping of pages can be used. In the example of FIG. 2, the group commit marker can be analyzed at box 215. However, in FIG. 3, the process is further refined sot that an entire range of pages is invalidated if a data fragment had begun being programmed but no commit marker is found. This algorithm still follows the principle of assuming the worst case page corruption. But now the minimum granularity of a program region increases from 1 page to the rest of a block or other group of pages.

As an alternative, the process can attempt to find two consecutive pages that do not contain data, and then invalidate the first one. This change will still find the last page that could have been written to, and invalidate it. In all of these variations, if there is an empty page following committed data, or an empty page at the start of a block, then, at worst, only one page has been corrupted. For this reason the process includes boxes 217, 219, and 221 which mark that page as dirty and the next page as free.

An unstable cell as mentioned above, reading from the same location may output 0 (a programmed bit) or sometimes may output 1 (corresponding to a recently flashed free bit or empty). In the operation of flash memory, a cell is reliable only if successfully flashed or successfully programmed. If either of these processes has been interrupted, then the cell is unstable or corrupted. The only way to return to a stable state is to flash the whole page containing the cell. Accordingly, the page with the empty header will be flashed and rewritten. The subsequent page is also flashed to become the next free page.

If the previous page does not contain valid and confirmed data (non power loss fragment), then it is assumed that from the previous valid data fragment in this block (or the start of the block if no valid fragment is found) on-ward, the largest size of data fragment is invalidated.

The space lost by invalidating at least one page for the first free block during initialization is considered insignificant, as this condition only exists following an unexpected shutdown. Also, this space is regained when the invalid pages are reset to a known state (erased) by a reclaim or garbage collection procedure. This kind of process guarantees there is no corruption in any page prior to a write in the page.

Figure 4:
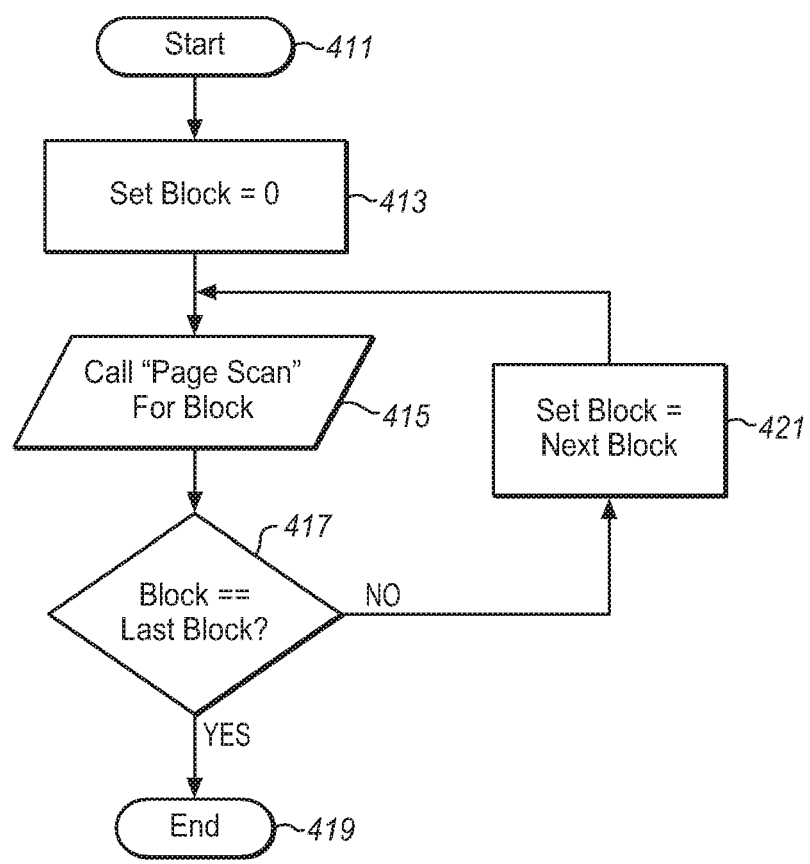
FIG. 4 is a process flow diagram of scanning pages through blocks of a memory array to find a first free block in accordance with an embodiment.

FIG. 4 presents a more basic version of the present invention. In the example of FIG. 4, the process starts at box 411. At box 413, the first block is identified and the scanning starts for each page. At box 415, each page in the block is scanned. At box 417, if the current block is the last block, then the process ends at box 419. If the current block is not the last block, then at box 421, the process goes to the next block and repeats. The page scan process can be the process of FIGS. 2 or 3, or any of the other processes and variations described herein.

Figure 5:
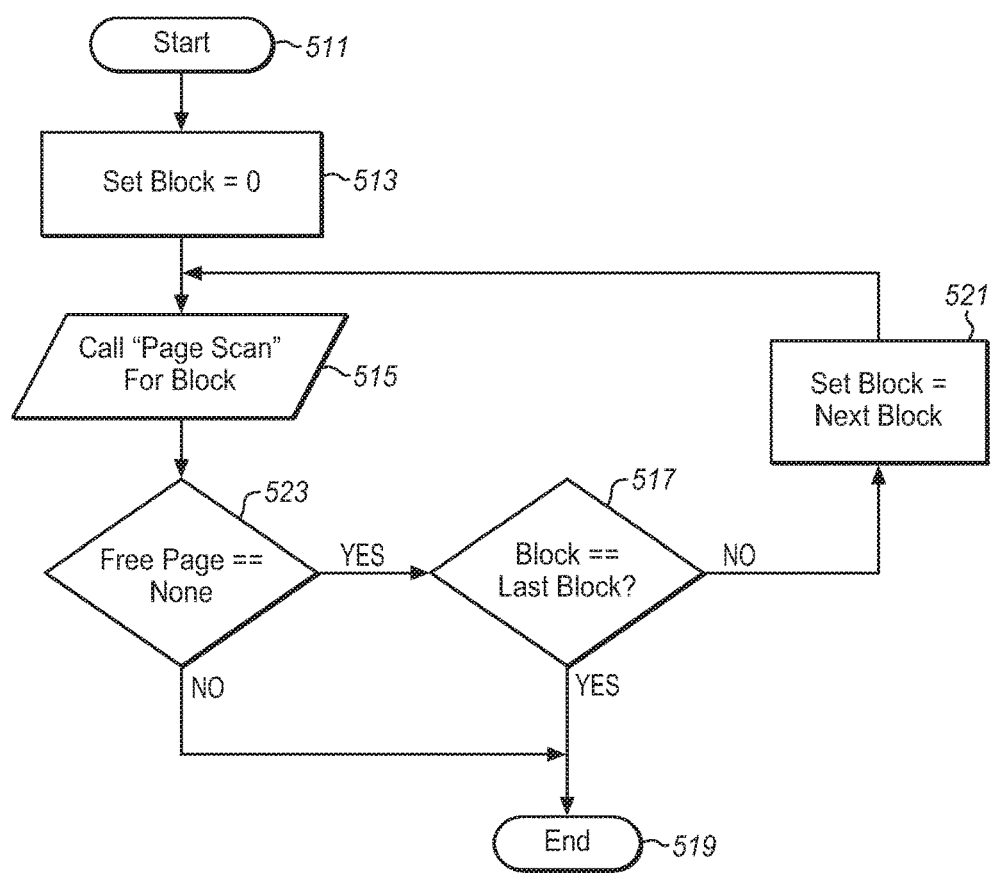
FIG. 5 is a process flow diagram of scanning pages through blocks of a memory array to find a first free block in accordance with another embodiment.

FIG. 5 shows a further variation on the process of FIG. 4. As in FIG. 4, the process starts at box 511 and initializes to the first logical block at box 513. The pages of that block are scanned at box 515. The process iterates through box 517 so that if the block is the last block, the process ends at box 519. If the current block is not the last block at box 517, then the process goes to the next block at box 521 and repeats to box 515.

However, in the example of FIG. 5, the pages of each block are scanned until a single free page is found at box 523. In other words, the pages for a block are scanned at box 515. If no free page is found, then decision box 523 directs the process to box 517 and, as with FIG. 4, the process cycles on the next block or ends if the current block is the last block. However, if the page scanning finds a free page, then decision box 523 ends the process at box 519. This can greatly reduce the time required to mount the drive and to find the corrupted page.

This alternative works especially well when blocks are always used in the same sequence or order. If there is only one page being used at a time, then the first free page in a block will be the first free page for the whole memory array. This page is then the only possible corrupt page. If, on the other hand, the memory controller does not always follow the same sequence through the pages, or if more than one page can be written at the same time, then the process can continue through all of the block to determine the first free page for each block.

As described above, for flash memory when a memory cell is un-written, then it does not contain confirmed valid data or confirmed invalid data. There are variety of different possible ways to determine what is or is not valid data. In the above example, a commit marker is used to mark valid data fragments after they are written. However, any other approach can be substituted for the commit marker, depending on the particular application. A commit marker as well as other techniques can also be used for other types of memory cells, such a PCM, MRAM, and FRAM.

Figure 6:
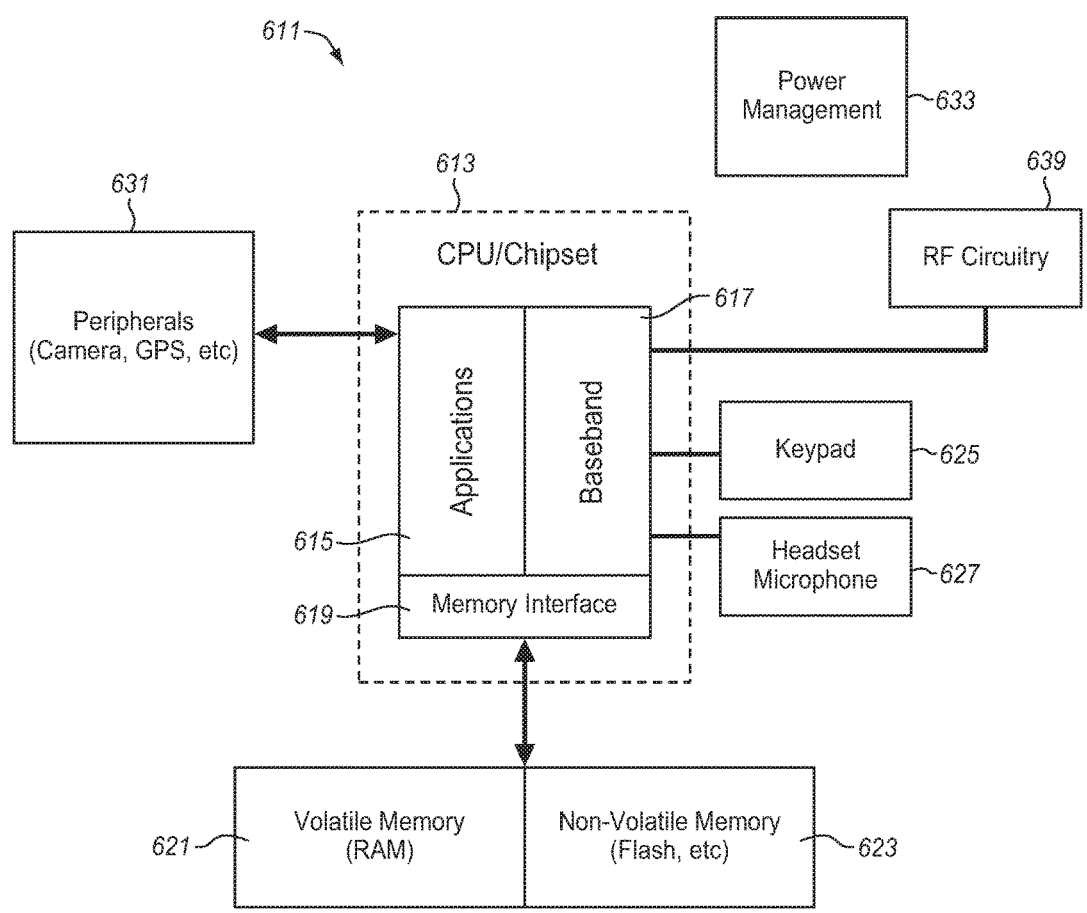
FIG. 6 is a block diagram of mobile device capable of implementing the processes of FIGS. 2 through 5 according to an embodiment.

FIG. 6 shows an example system 611 to which embodiments of the invention may be applied. In the illustrated example, the system is a mobile, handheld, cellular telephone, however, with a few modification, the system may represent a broad range of different devices. The system is driven by a central processing unit (CPU) 613 that may or may not include a chipset. The CPU has an applications section 615 that executes programs using an operating system and a baseband section 617 that handles telephony functions. Both sections are coupled to a memory interface 619 that communicates through a bus with the system's memory.

In the illustrated example, the system memory has a volatile section 621 which may be implemented as random access memory (RAM) for high speed access and a non-volatile section 623, which may be implemented as flash, for data that must survive a power loss. Typically the RAM is used as short term storage for data and instructions that must be accessed quickly, while the flash is used to store operating systems, system parameters and applications. The memory may alternatively be implemented as a single memory entirely in flash and the flash section may be implemented with other types of non-volatile memory, such as PCM (phase change memory), MRM, or FRM, or some combination of memory types. The operations described above in the context of FIGS. 2 and 3 are applied to the non-volatile memory. In the event of a power loss, all data stored in the volatile memory will be lost.

The baseband section of the CPU is coupled to a user interface. In the illustrated example, the user interface has a keypad 625 and a headset 627 with a speaker and a microphone. A variety of other interfaces may be used such as a touch screen, Bluetooth devices, accelerometers, proximity sensors, and other interfaces, depending on the particular application. The baseband section is also coupled to RF (Radio Frequency) circuitry 629 to allow the system to communicate with external devices using a radio connection. The radio connection may be cellular telephone, data, wireless network, or any other interface as desired.

The CPU may also be coupled to any of a variety of peripherals 631, such as cameras, location systems, displays, printers, Bluetooth devices and other peripherals to support any additional functions of the system 611. FIG. 6 also shows a power management system 633 which may include a power supply, such as a battery to regulate the power consumption of the various components. This device may be software driven and controlled by the CPU or autonomous, or a combination of both. In one example, the power management sets a flag at a register accessible to the CPU when there is a power loss.

Figure 7:
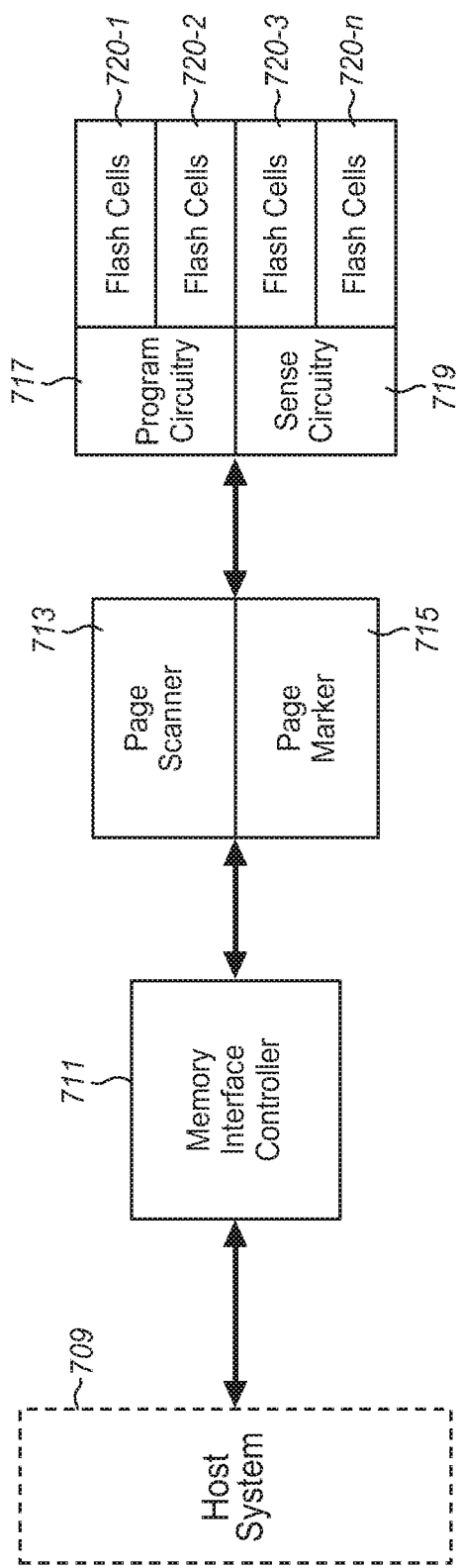
FIG. 7 is a block diagram of a power loss recovery system in accordance with an embodiment.

FIG. 7 is a block diagram of one example of a power loss recovery system capable of implementing the process of the above flow diagrams. The system is attached to a host system 709. The host system can be a computer, a cellular telephone, mobile interact device, entertainment system component, or any of a variety of other devices. The host system is coupled to a memory interface controller 711 which may be in the form of specialized hardware. The memory interface controller is coupled to a page scanner 713 and a page marker 715, which are in turn coupled to a program circuitry 717 and sense circuitry 719. The sense and program circuitry are coupled to flash memory cells 720-1, to 720-4. While only four cells are shown, there are typically hundreds, thousands or more cells in an actual array.

The page scanner operates to scan the pages of memory cells as indicated above and determine which pages are valid, free, and invalid. The page marker operates to mark pages based on the results of the page scanner and also during the course of using the memory. The sense circuitry reads the values of the cells and the markers and provides those values to the page scanner. The program circuitry writes to the cells and, if the markers are in memory array, it writes the markers. If the markers are in a separate location, they may be written to that separate location. The memory interface controller controls the operation of the memory and the other illustrated components. It also controls the operation of the interface to the host system.

The term "computer readable medium" refers to suitable medium that participates in providing program instructions to a processor, a memory controller or other suitable device for execution. Such a medium may take many forms, including but not limited to, non-volatile media, and volatile media. Non-volatile media may include, for example, optical or magnetic disks, solid state storage and other memory, ROM, etc. Volatile media may include dynamic memory, such as system memory, DRAM, SRAM, and other types of volatile storage. Common forms of computer readable media include, for example, magnetic mediums (e.g., floppy disk, flexible disk, hard disk, magnetic tape, and other magnetic mediums), optical mediums (e.g., compact disc read-only memory (CD-ROM) and other optical mediums), physical medium with patterns (e.g., punch cards, paper tape, any other physical mediums), memory chips or cartridges, (e.g., RAM, programmable read-only memory (PROM), erasable programmable read-only memory (EPROM), flash memory, and other memory chips or cartridges), and any other medium from which a computer can read.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EE-PROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

Specific embodiments of the present invention have been described above, however, the invention is not limited to the details of such embodiments, but only by the claims below and their reasonable equivalents.

What is claimed:

1. A method, comprising:
   utilizing a hardware processor:
   determining that a first memory page of a NAND memory array contains data, the NAND memory array organized into multiple memory pages, the first memory page one of the multiple memory pages, each particular page including a header in a specifically allocated portion of the particular page;
   determining whether a header in the first memory page contains a commit marker, the commit marker specifying that a programming operation programming the data to the first memory page has finished;
   based on a determination that the header on the first memory page contains a commit marker, determining that a next memory page of the NAND memory array contains data;
   determining that a commit marker is not present in a header of the next memory page;
   responsive to determining that the commit marker is not present in the header of the next memory page, designating a page subsequent to the next page as a first available page for writing;
   receiving data to write to the NAND memory array; and
   writing the received data to the page marked as the first available page for writing.

2. The method of claim 1, further comprising:
   marking the next page invalid responsive to determining that the commit marker is not present in the header of the next memory page.

3. The method of claim 1, wherein the data on the first memory pace was written prior to the data on the next memory page.

4. The method of claim 1, wherein the next memory page is a next memory page in a sequential order of memory pages.

5. The method of claim 1, wherein the memory array is divided into blocks, each block containing multiple pages, wherein the first and next pages are both part of a first block, the method further comprising:
   scanning pages of a second block to find a first available page in the second block
   based on a determination that the first available page of the second block is at least the second page in the second block, marking the page before the first available page in the second block as invalid.

6. The method of claim 1, wherein the method further comprises determining that a power loss occurred, and wherein the operations of determining that the first memory page contains data, determining whether the header contains a commit marker, determining that the next memory page contains data, determining that the commit marker is not present in the header and designating the page subsequent to the next page as the first available page is performed responsive to determining that the power loss occurred.

7. The method of claim 1, method further comprises determining that the memory array is powered up, and wherein the operations of determining that the first memory page contains data, determining whether the header contains a commit marker, determining that the next memory page contains data, determining that the commit marker is not present in the header and designating the page subsequent to the next page as the first available page is performed responsive to determining that the memory array was powered up.

8. The method of claim 2, further comprising: erasing the next page responsive to marking the next page invalid during a subsequent garbage collection operation.

9. The method of claim 1, wherein the first page, next page, and subsequent page are on a same block of the NAND memory array and wherein the method further comprises:
   scanning multiple pages of a second block until a second page of the second block is found that is either empty, or has data written to it but does not have the commit marker set in the header; and
   responsive to finding the second page, designating a third page in the second block subsequent to the second page as a first available page in the second block for writing.

10. A NAND memory device comprising:
    a NAND memory array organized into multiple memory pages, each particular page including a header in a specifically allocated portion of the particular page;
    a hardware-based processor configured to perform operations comprising:
    determining that a first memory page of the NAND memory array contains data;
    determining whether a header in a specifically allocated portion on the first memory page contains a commit marker, the commit marker specifying that a programming operation programming the data to the first memory page finished;
    based on a determination that the header on the first memory page contains a commit marker determining that the next memory page of the NAND memory array contains data;
    determining that a commit marker is not present in a header of the next memory page;
    responsive to determining that the commit marker is not present in the header of the next memory page, designating a page subsequent to the next page as a first available page for writing;
    receiving data to write to the NAND memory array; and
    writing the received data to the page marked as the first available page for writing.

11. The NAND memory device of claim 10, wherein:
    the operations further comprise: marking the next memory page as invalid; and
    erasing the page marked as invalid.

12. The NAND memory device of claim 11, wherein the operations of erasing the page marked as invalid occurs during a subsequent garbage collection operation.

13. The NAND memory device of claim 10, wherein the first page, next page, and subsequent page are on a same block of the NAND memory array and wherein the operations further comprise:
    scanning multiple pages of a second block until a second page of the second block is found that is either empty, or has data written to it but does not have the commit marker set in the header; and
    responsive to finding the second page, designating a third page in the second block subsequent to the second page as a first available page in the second block for writing.

14. A non-transitory computer-readable storage medium containing instructions that, when executed by one or more hardware-based processors, causes the one or more hardware-based processors to perform operations comprising:

determining that a first memory page of a NAND memory array contains data, the NAND memory array organized into multiple memory pages, the first memory page one of the multiple memory pages, each particular page including a header a specifically allocated portion of the particular page;

determining whether a header in a specifically allocated portion on the first memory page contains a commit marker, the commit marker specifying that a programming operation programming the data to the first memory page finished;

based on a determination that the header on the first memory page contains a commit marker, determining that a next memory page of the NAND memory array contains data;

determining that a commit marker is not present in a header of the next memory page;

responsive to determining that the commit marker is not present in the header of the next memory page, designating page subsequent to the next page as a first available page for writing;

receiving data to write to the NAND memory array; and writing the received data to the page marked as the first available page for writing.

15. The non-transitory computer-readable storage medium of claim 14, wherein the operations further comprise marking the next page as invalid.

16. The non-transitory computer-readable storage medium of claim 14, wherein the operations further comprise: marking the next memory page as invalid; and erasing the page marked as invalid during a subsequent garbage collection operation.

17. The non-transitory computer-readable storage medium of claim 14, wherein the first page, next page, and subsequent page are on a same block of the NAND memory array and wherein the operations further comprise:

scanning multiple pages of a second block until a second page of the second block is found that is either empty, or has data written to it but does not have the commit marker set in the header; and responsive to finding the second page, designating a third page in the second block subsequent to the second page as a first available page in the second block for writing.

* * * * *